United States Patent [19]

Deschamps

[11] 4,257,022

[45] Mar. 17, 1981

[54] MAGNETOSTRICTIVE ROD FILTERS

[75] Inventor: Rene G. Deschamps, Paris, France

[73] Assignee: Societe Anonyme de Telecommunications, Paris, France

[21] Appl. No.: 2,102

[22] Filed: Jan. 9, 1979

[30] Foreign Application Priority Data

Jan. 11, 1978 [FR] France .............................. 78 00709

[51] Int. Cl.$^3$ ...................... H03H 9/62; H03H 9/135
[52] U.S. Cl. .................................... 333/201; 310/26; 333/148
[58] Field of Search ............... 333/186, 148, 201, 200; 331/156; 310/26; 330/60, 63

[56] References Cited

U.S. PATENT DOCUMENTS 1,882,394  10/1932  Pierce .................................. 333/201
1,882,396  10/1932  Pierce .................................. 333/201

Primary Examiner—Marvin L. Nussbaum
Attorney, Agent, or Firm—Abraham A. Saffitz

[57] ABSTRACT

Magnetostrictive rod filter whose attenuation versus frequency curve has a resonance as the conventional magnetostrictive rod filters but also a pole at a frequency near the resonance frequency. The filter comprises a freely vibrating magnetostrictive rod, two windings symmetrically located with respect to the rod center and surrounding the rod, ferrimagnetic material sheaths surrounding the windings except on the parts thereof facing the rod and means for applying a d.c. magnetic field to the rod. The pole of the attenuation curve is due to a demagnetizing field created by portions of the rod externally projecting beyond the windings and by apertures in those parts of the sheaths facing these rod projecting portions.

3 Claims, 4 Drawing Figures

MAGNETOSTRICTIVE ROD FILTERS

BACKGROUND OF THE INVENTION

1. Field of the Invention

This invention relates to magnetostrictive filters and, more particularly, to magnetostrictive rod filters in which the magnetostrictive rod is able to vibrate freely.

2. Description of the Prior Art

Filters with magnetostrictive rods have already been studied. An article by H. H. HALL was published in the Proceedings of the Institute of Radio Engineers, volume 21, No. 9, September 1933, pp. 1328–1338. Then two articles by A. P. THIELE describe such filters: "Narrow band magnetostrictive filters" in "Electronic and Radio Engineer", November 1958, pages 402–411 and "Magnetostrictive filters" in Electronics, June 1959, pages 72–74. These types of filters are basically formed of a magnetostrictive rod placed inside a glass or plastic sheath and surrounded by two separate windings. Each winding is placed on one or the other side of the center of the bar. Permanent magnets are judiciously placed to create a permanent field inside the rod.

However, these types of filters have attenuation curves which have no pole, i.e. no infinite attenuation point and thus cannot be often used in industry.

The purpose of this invention is to mitigate the defect and to construct magnetostrictive rod filters having attenuation poles and, in addition, to place the attenuation poles at the frequency positions required by the technology, in relation to the zeros of the attenuation curve.

SUMMARY OF THE INVENTION

According to the invention, the filter basically comprises a magnetostrictive rod surrounded by input and output windings placed on either side of the center of the rod, permanent magnets to create a d.c. magnetic field inside said rod, said windings being themselves surrounded by ferrite sheaths and means for producing a demagnetizing field at each end of said rod, the said demagnetizing field inducting a voltage in said input or output winding and being due to portions of the rod projecting from each end of the corresponding winding by opening the exterior edges and to apertures in said ferrite sheaths without interposition of any material.

BRIEF DESCRIPTION OF THE DRAWINGS

Other features and advantages will appear on reading the following description which is illustrated by the accompanying drawings in which.

DESCRIPTION OF THE PREFERRED EMBODIMENTS

Figure 1:
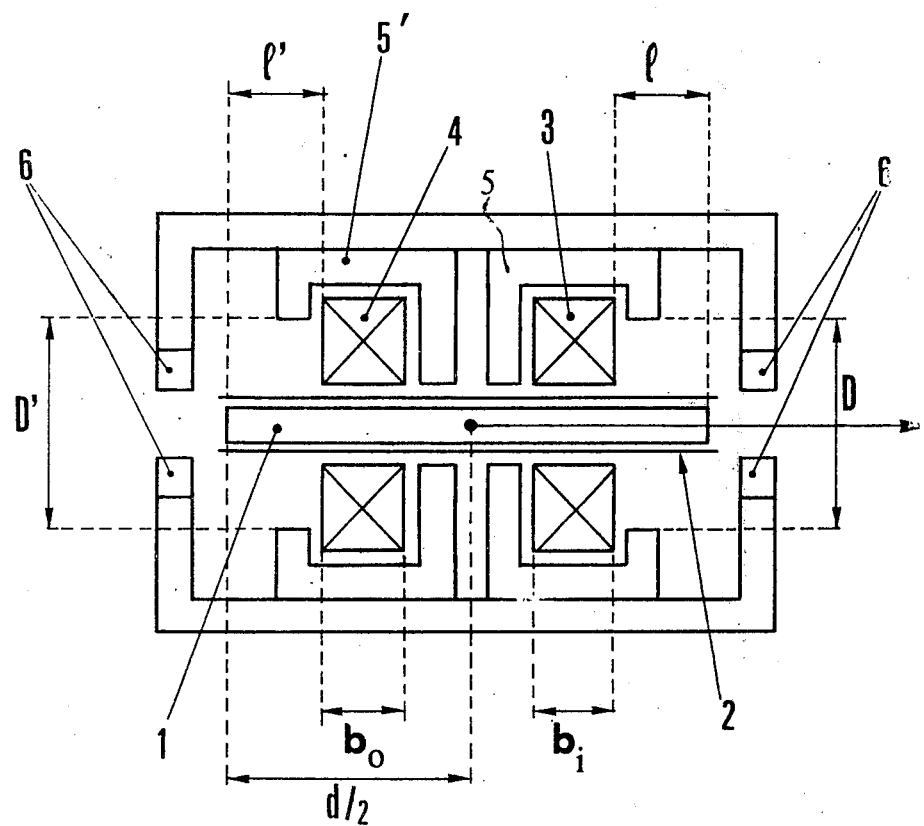
FIG. 1 shows a cross-section of a magnetostrictive rod filter according to the invention.

Referring to FIG. 1, a magnetostrictive rod filter basically comprises a rod 1 made of magnetostrictive material able to vibrate freely in a sheath 2 made of glass or of plastic. Input and output windings are designated by 3 and 4, respectively and are placed around the rod on either side of its center. Each winding is surrounded by a suitable ferrite sheath, for example, sheath 5 for filter input winding 3 and sheath 5' for filter output winding 4. Permanent magnets 6 are arranged on either side of the rod center line, near to each end in order to create a continuous field as uniformly as possible inside rod 1. Thus input winding 3 and output winding 4 are only connected by means of magnetoelactic vibrations which run through the rod. There is practically no direct coupling. Furthermore, ferrite sheaths 5 and 5' enable the magnetic induction created by the windings to be localized, and the induction lines that cross rod 1 to be looped.

Rod 1 projects by respective distances l and l' beyond each end of windings 3 and 4. A demagnetizing field due to each end of rod 1 opposes the magnetic field induced by the windings and takes on significant values. This field at the ends of the bar is expressed by $(H_d)_{x=d/2}$ and $(H_d)_{x=-d/2}$ if the length of the bar is d. It is thus necessary to take account of the electric voltage induced by the demagnetizing fields directly in the windings.

The mechanical waves created in rod 1 are assumed to be longitudinal; the rod is in fact cylindrical with a circular cross-section and the end sides are at right angles to the center line of rod 1.

If Ox is the center line of rod 1, and 0 is its center, the movement of the rod material at a point of abscissa x is expressed by equation:

$$\frac{\delta^2 u}{\delta x^2} + s\rho\omega^2 u = 0 \tag{1}$$

where:

$\rho$ is the specific weight of the rod material;

$\omega$ is the angular frequency;

s is the component $s_{1111}$ of the compliance tensor;

$\gamma$ is the propagation constant of a longitudinal mechanical wave in the rod given by equation:

$$\gamma = \omega\sqrt{\rho s} \tag{2}$$

The solution of equation (1) is:

$$u = Ue^{j\gamma x} + U'e^{-j\gamma x} \tag{3}$$

where U and U' are constants.

The magnetic field created by the input winding in rod 1 extends over a distance equal to $b_i$ the length of winding 3. In the same way, the magnetic field created by the output winding in rod 1 extends over a distance equal to $b_o$ the length of winding 4. Ferrite sheaths 5 and 5' surround windings 3 and 4. These sheaths may be enlarged near to the ends of the rod to dimension D (respectively D') depending on whether the sheath surrounds input winding 3 or output winding 4. These sheaths may also be increased in size near to the center of the rod depending on the application given to the filter, as is stated below.

A filter is designated by its electrical characteristics. Ampere's theorem and the on limits conditions enables the following to be written.

$$j\gamma S[Ue^{j\gamma d/2} - U'e^{-j\gamma d/2}] = (\mu/\mu_o)Sgt_iB_i \tag{4}$$

$$j\gamma S[Ue^{-j\gamma d/2} - U'e^{j\gamma d/2}] = (\mu/\mu_o)Sgt_oB_o \tag{5}$$

in which g is the component $g_{111}$ of the piezomagnetic tensor of the rod material, $B_i$ is the component along Ox of the magnetic induction in rod 1 and at input winding 3 and $B_o$ is the component along Ox of the magnetic induction in the rod and at the output winding 4. $t_i$ and $t_o$ are coefficients without dimension defind by:

$$\mu_o(H_d)_{x=d/2} = t_i B_i$$

$$\mu_o(H_d)_{x=-d/2} = t_o B_o$$

in which S is the area of the rod cross-section $\mu_o = 1.256 \times 10^{-6}$ henries/meter is the permeability of air and $\mu$ is the permeability of rod material.

The voltage $V_i$ at the terminals of the input winding 3 and the voltage $V_o$ at the terminals of the output winding 4 are functions of the magnetic inductions in rod 1, $B_i$ and $B_o$, and are written:

$$V_i = j\omega B_i N_i S b_i - j\omega z_i B_i N_i S b_i \quad (6)$$

$$V_s = j\omega B_o N_o S b_o - j\omega z_o B_o N_o S b_o \quad (7)$$

in which $N_i$ and $N_o$ are the number of wire turns in windings 3 and 4 respectively and $z_i$ and $z_o$ are functions of the distances l and l' of each winding to the corresponding end of rod 1, of the cross-sectional area S of the rod and of other parameters such as the sheath aperture dimensions D and D'. The other reference letters in equations (6) and (7) have already been defined.

Another method that provides for increasing the influence of the demagnetizing field consists of increasing the diameter of the rod. It is also possible to enlarge the opening of the ferrite sheaths near to the center of the rod; however, in this case, the low frequency characteristics of the filter are deteriorated.

Composite attenuation of this type of filter is expressed as a function of $(E_G^2/V_o)$, $E_G$ being the electromotive force of a generator of internal impedance $R_G$ connected to the filter input and $V_o$ is the output voltage as the filter terminals.

The attenuation is expressed as a function of a number of parameters, among which $\gamma$. It is of particular interest to bring out the variable:

$$X = W \sin \gamma d = W y$$

in which W is a quantity significantly independent of the frequency and of a very high value.

The resonances correspond to zeros of $(E_G^2/V_o)$, i.e. to values $X_o$ of X which are near X=0 therefore correspond to $\sin \gamma d = 0$.

The poles correspond to infinites of $(E_G^2/V_o)$, i.e. to values $X_p$ of X given by:

$$X_p = 2y_o + 2\frac{t_i}{t_o}\frac{1}{z_o} \quad (8)$$

The expression $X_p$ of the poles allow the positioning of the poles with respect to the resonances.

Figure 2:
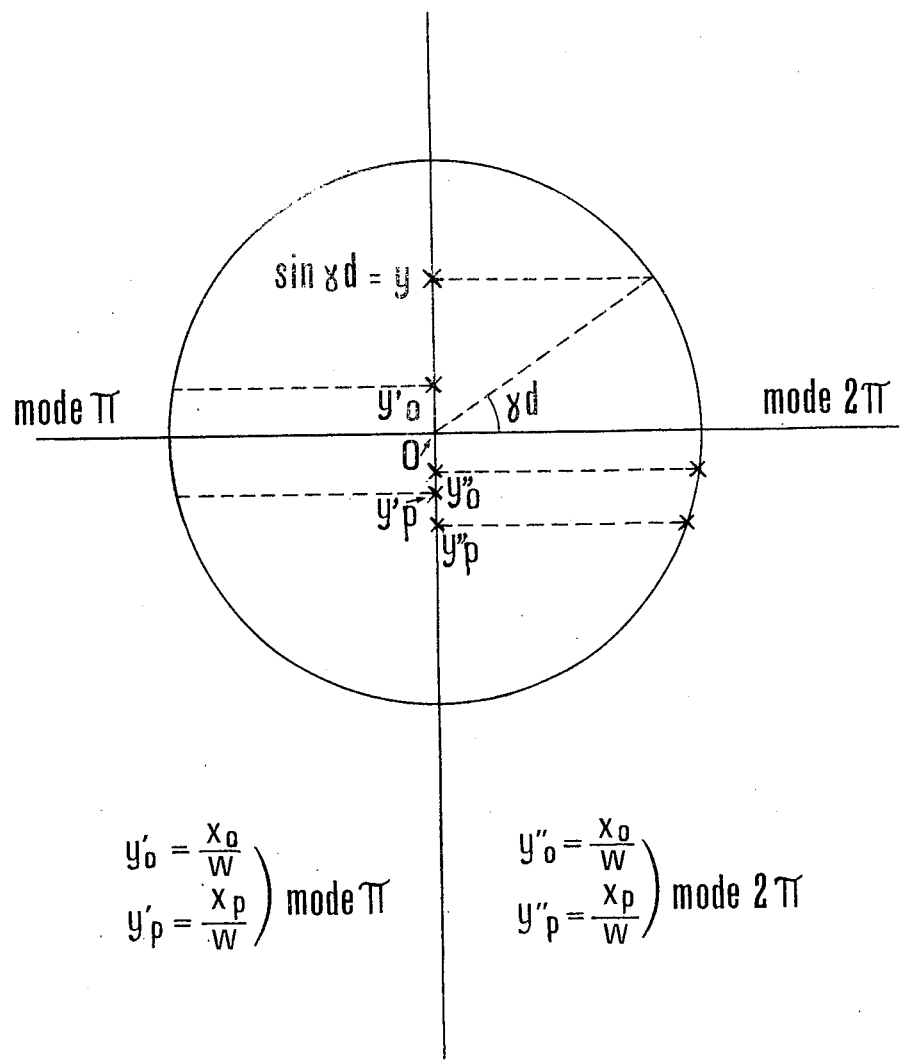
FIG. 2 illustrates points corresponding to resonances and attenuation poles on a circle of unity diameter.

When $\gamma d = (2k+1)\pi$ where k is a positive integer, the rod vibrates according to the half-wave mode. $X_p$ is smaller than $X_o$, then $f_p > f_o \cdot z_o$ is in general negative and resonance takes place at a value $X_o$ of X which is in general positive and small in relation to the value of W and therefore to a value of $\gamma d$ very slightly less than $\pi$. FIG. 2 illustrates the quantities:

$$Y_o' = X_o/W \text{ and } Y_p' = X_p/W$$

When $\gamma d = 2k\pi$ where k is a positive integer the rod vibrates in the full-wave mode. $X_p$ is greater than $X_o$, then $f_p < f_o \cdot z_o$ is quite negative and resonance takes place at a value $X_o$ of X which is in general negative and small in relation to the value of W and therefore to a value of $\gamma d$ very slightly less than $2\pi$. FIG. 2 illustrates the quantities $Y_o'' = X_o/W$ and $Y_p'' = X_p/W$.

It is possible to obtain a demagnetising field such that $X_p/W$ is very near to $X_o/W$ thus such that a maximum attenuation frequency is very close to a resonance. It is sufficient that coefficients $z_o$ and $z_i$ are sufficiently great as is shown in the previous expressions.

The various parameters which intervene in the calculation of $z_o$ for example, the cross-sectional area S of rod 1, length d of the rod, distance l, the opening dimension D may be modified depending upon the mode of vibration envisaged and depending upon the sizes of the filters to be designed.

Figure 3:
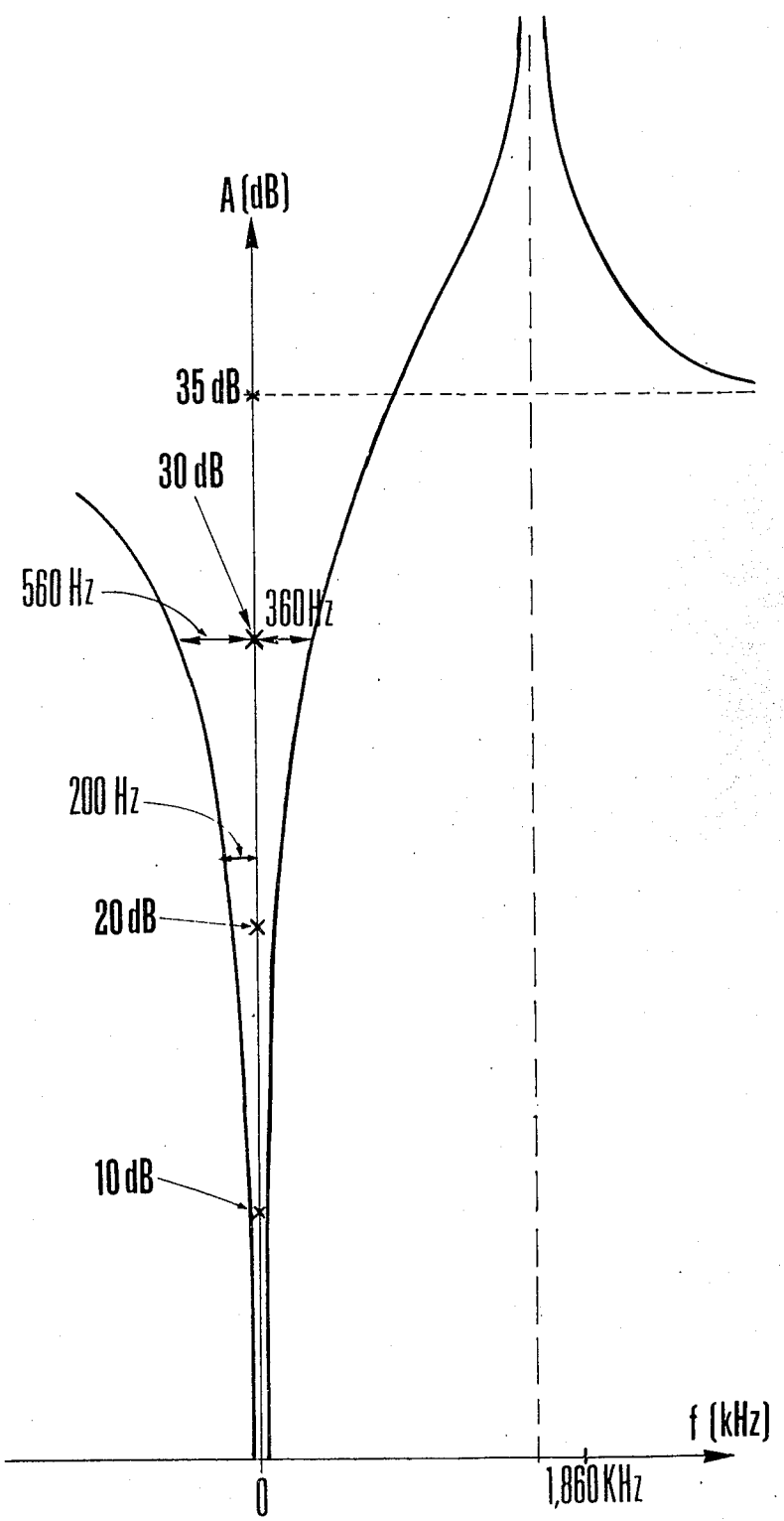
FIG. 3 illustrates the attenuation versus frequency curve of a filter according to the invention.

An attenuation curve of a filter, according to the invention, is represented in FIG. 3. This type of filter is formed of a cylindrical ferrite rod of length d=22 mm, of diameter 4 mm and whose ends are at a distance l=2.5 mm from the windings, the opening D of the sheaths being equal to 6 mm. This type of filter vibrates in accordance with the $\pi$ mode. Its attenuation curve has a pole near to the attenuation minimum at a frequency higher by 1,860 kHz from this minimum. Furthermore, attenuation increases very rapidly near to its minimum.

Figure 4:
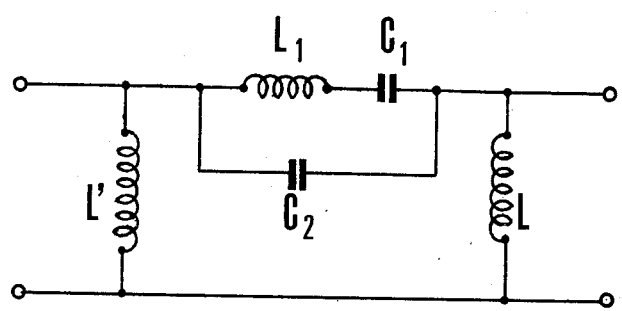
FIG. 4 is a lumped electrical diagram of the filter according to the invention.

FIG. 4 is a lumped electrical diagram of the filter according to the invention. If $f_o$ is the resonance frequency of rod 1, the filter according to the invention, is a quadripole of input inductance L and output inductance L', the inductances being directly connected together on one side and connected on the other side by two parallel branches, one of the branches with a capacitor $C_2$, the other branch with an inductor $L_1$ placed in series with a capacitor $C_1$.

Resonance then takes place for values of $C_1$ and $L_1$ such that:

$$L_1 C_1 = (2\pi f_o)^2$$

The value of $C_2$ is determinant for estimation of the pole of maximum attenuation.

I claim:

1. A magnetostrictive rod filter comprising:
   a freely vibrating magnetostrictive rod;
   an input winding and an output winding placed on either side of the center of and surrounding said rod;
   ferrimagnetic material sheaths respectively surrounding said input and output windings;
   permanent magnetic field producing means for applying a longitudinal d.c. magnetic field to said rod;
   a demagnetizing field producing means at each end of said rod inducing a voltage respectively in said input and output winding;
   said demagnetizing field producing means consisting of the portions of said rod externally projecting beyond said windings and by apertures in the part of said ferrimagnetic material sheaths facing the projecting portions of said rod.

2. A magnetostrictive rod filter as set forth in claim 1 in which the rod has a length d and is made of a magnetostrictive material having a mechanical wave propagation constant $\gamma$, the product $\gamma d$ being equal to $(2k+1)\pi$ where k is a positive integer, the rod vibrates in the half-wave mode and the attenuation versus frequency curve of the filter has an attenuation pole at a frequency slightly higher than its zero attenuation.

3. A magnetostrictive rod filter as set forth in claim 1 in which the rod has a length d and is made of a magnetostrictive material having a mechanical wave propagation constant $\gamma$, the product $\gamma d$ being equal to $2k\pi$ where k is a positive integer, the rod vibrates in the full-wave mode and the attenuation versus frequency curve of the filter has an attenuation pole at a frequency slight lower than the zero attenuation.

* * * * *